US006172385B1

(12) United States Patent
Duncombe et al.

(10) Patent No.: US 6,172,385 B1
(45) Date of Patent: Jan. 9, 2001

(54) MULTILAYER FERROELECTRIC CAPACITOR STRUCTURE

(75) Inventors: Peter Richard Duncombe; Robert Benjamin Laibowitz, both of Peekskill, NY (US); Deborah Ann Neumayer, Danbury, CT (US); Katherine Lynn Saenger, Ossining; Thomas Mcarraoll Shaw, Peekskill, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/183,413

(22) Filed: Oct. 30, 1998

(51) Int. Cl.⁷ .................................................. H01L 29/72
(52) U.S. Cl. .................................................. 257/295
(58) Field of Search .................................. 257/295, 532

(56) References Cited

U.S. PATENT DOCUMENTS

| | | |
|---|---|---|
| 5,558,946 | 9/1996 | Nishimoto . |
| 5,645,885 | 7/1997 | Nishimoto . |
| 6,094,369 * | 7/2000 | Ozawa et al. ........................ 257/295 |

* cited by examiner

*Primary Examiner*—Edward Wojciechowicz
(74) *Attorney, Agent, or Firm*—Scully, Scott, Murphy & Presser; Robert M. Trepp, Esq.

(57) ABSTRACT

Multilayer ferroelectric capacitor structures comprising a ferroelectric film having a combination of different ferroelectric materials or compositions such as strontium bismuth tantalate, strontium bismuth niobate, bismuth titanate, strontium bismuth tantalate niobate, lead zirconate titanate, lead lanthanum zirconate titanate are disclosed. A method of preparing the multilayer ferroelectric film containing at least two different ferroelectric materials and/or more than one composition of ferroelectric material is also disclosed.

15 Claims, 3 Drawing Sheets

MULTILAYER FERROELECTRIC CAPACITOR STRUCTURE

DESCRIPTION

1. Field of the Invention

The present invention relates to ferroelectric films and in particular to semiconductor structures which contain a multilayer ferroelectric film as a capacitive element. The present invention also describes a method which can be employed in fabricating multilayer ferroelectric films that exhibit reduced leakage current and improved microstructural porosity.

2. Background of the Invention

Layered ferroelectric films such as strontium bismuth tantalate (SBT), strontium bismuth niobate (SBN) and strontium bismuth tantalate niobate (SBTN) generally require long annealing times (on the order of 30–90 minutes or longer) and high processing temperatures (800° C.) for optimum film crystallization and electrical properties. The resultant ferroelectric films are characterized as having highly asymmetric grains and an inherent porosity.

If lower processing temperatures or times are employed, the resultant ferroelectric films typically exhibit poor leakage behavior, low remanent polarization and low fatigue. In addition, under prior art annealing conditions, oxidation of the electrodes and the underlying contacts may result in high resistivity contacts.

Moreover, by utilizing prior art annealing conditions, interfacial layers may result between the electrodes and underlying contact and/or between the ferroelectric material and the electrode. For instance, Bi readily forms Bi/Pt alloys which may degrade the performance of the capacitor.

In the semiconductor industry, single layered ferroelectric films comprising one ferroelectric material or composition are generally employed in fabricating various electronic devices such as non-volatile storage devices (non-volatile random access memory (NVRAM) and ferroelectric random access memory (FRAM)). The prior art semiconductor devices containing a single layer ferroelectric film have limited operations since the single layered films are inherently porous and leaky. These properties can result in device failures; therefore a solution to the same is required.

In view of the above drawbacks with prior art methods of producing single layer ferroelectric films, there is a continued need for developing new and improved methods of fabricating ferroelectric films which, when used as a capacitive element of a semiconductor device, exhibit reduced leakage current, as well as having improved microstructural porosity, polarization and fatigue. It is noted that the term "single layered ferroelectric film" is used herein to denote a film composed of one "multilayer ferroelectric film" is used herein to denote a film composed of more than one ferroelectric material and/or more than one composition of the ferroelectric material.

SUMMARY OF THE INVENTION

The present invention provides a multilayer ferroelectric capacitor structure and a method for fabricating a multilayer ferroelectric film which exhibits reduced leakage current and improved microstructural porosity than heretofore reported in prior art single layer ferroelectric films.

In one aspect of the present invention, the multilayer ferroelectric film of the present invention is used in fabricating a capacitive element. Specifically, the present invention provides a capacitive element which comprises a substrate; a first electrode formed on said substrate; a multilayer ferroelectric film formed on said first electrode, said multilayer ferroelectric film being composed of (i) more than one ferroelectric material, (ii) more than one composition of the ferroelectric material or (iii) both (i) and (ii); and a second electrode formed on the multilayer ferroelectric film.

The term "ferroelectric material or composition" is used herein to denote any crystalline, polycrystalline, or amorphous substance which displays spontaneous electric polarization. The preferred ferroelectric materials or compositions that are employed in the present invention are perovskite-type oxides which contain at least one acidic oxide containing a metal from Group IVB (Ti, Zr or Hf), VB (V, Nb or Ta), VIB (Cr, Mo or W), VIIB (Mn or Re) or IB (Cu, Ag or Au) of the Periodic Table of Elements (CAS version) and at least one additional cation having a positive formal charge of from about 1 to about 3.

Suitable perovskite-type oxides include, but are not limited to: titanate-based ferroelectrics, manganatebased materials, cuprate-based materials, tungsten bronze-type niobates, tantalates, or titanates, and bismuth layered-tantalates, niobates or titanates. Of these perovskite-type oxides, strontium bismuth tantalate, strontium bismuth niobate, bismuth titanate, strontium bismuth tantalate niobate, lead zirconate titanate and lead lanthanum zirconate titanate are highly preferred in the present invention.

The term "substrate" is used broadly to denote any semiconducting wafer or material which may contain active device regions embedded therein as well as an insulator layer on its upper surface.

The present invention also provides non-volatile storage devices such as NVRAM and FRAM which comprise at least the multilayer ferroelectric film, i.e. capacitive element, of the present invention. The multilayer ferroelectric film of the present invention can also be employed as the capacitive element in dynamic random access memory (DRAM) cells.

Another aspect of the present invention relates to a method of fabricating a multilayer ferroelectric film which exhibits reduced leakage current and improved microstructural porosity. In accordance with this aspect of the present invention, the method comprises the steps of:

(a) forming a multilayer ferroelectric film, said multilayer ferroelectric film being composed of more than one ferroelectric material and/or more than one composition of the ferroelectric material; and (b) annealing said multilayer ferroelectric film at a temperature below 800° C. for a time period of from about 5 to about 120 minutes.

DETAILED DESCRIPTION OF THE DRAWINGS

Figure 1A:
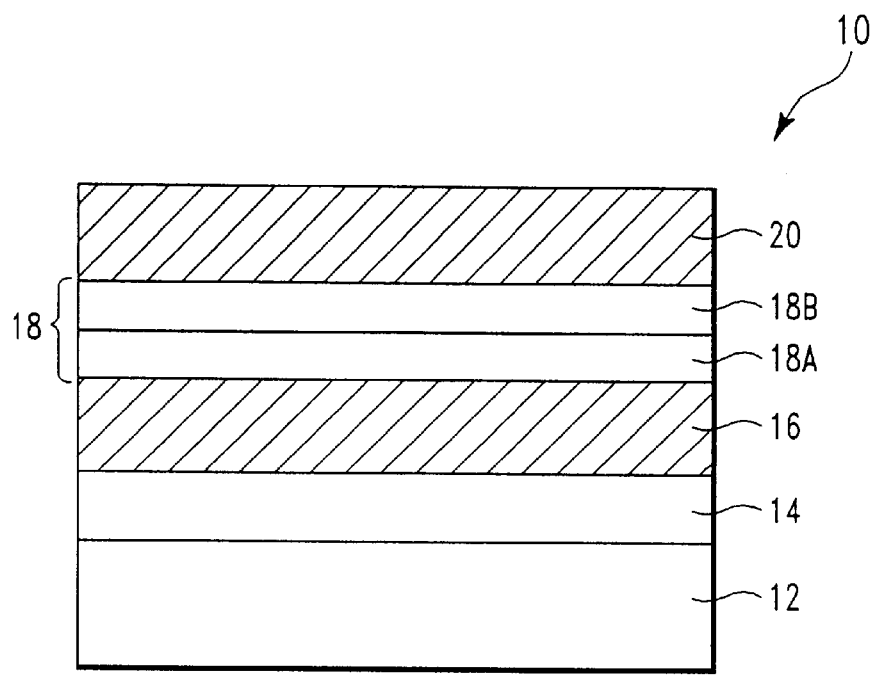
FIGS. 1(A)–(B) are cross-sectional views of capacitors which are prepared in accordance with the present invention; (A) a capacitor containing a multilayer ferroelectric film comprising two different ferroelectric materials and/or more than one composition of the ferroelectric material sandwiched between a first and second electrode; and (B) a capacitor containing three different ferroelectric materials and/or more than one composition of the ferroelectric material which are sandwiched between a first and second electrode.

The present invention will now be described in more detail by referring to the drawings which accompany the present application. It is noted that in the accompanying drawings like reference numerals are used for describing like and corresponding elements. Reference is made to FIGS. 1(A) and (B) which show capacitive elements which contain the multilayer ferroelectric film of the present invention. Specifically, in FIG. 1(A), the capacitive element 10 comprises a semiconductor substrate or wafer 12, an insulator layer 14 formed on said semiconductor substrate or wafer 12, a first electrode (or lower electrode) 16 formed on said insulator layer, a multilayer ferroelectric film 18 composed of two different ferroelectric materials and/or more than one composition of ferroelectric material (denoted as 18A and 18B, respectively) formed on first electrode 16, and a second electrode (or upper electrode) 20 formed on the upper most surface of the ferroelectric film, i.e. ferroelectric material 18B. In this embodiment, ferroelectric material 18A is a different composition than ferroelectric material 18B.

Figure 1B:
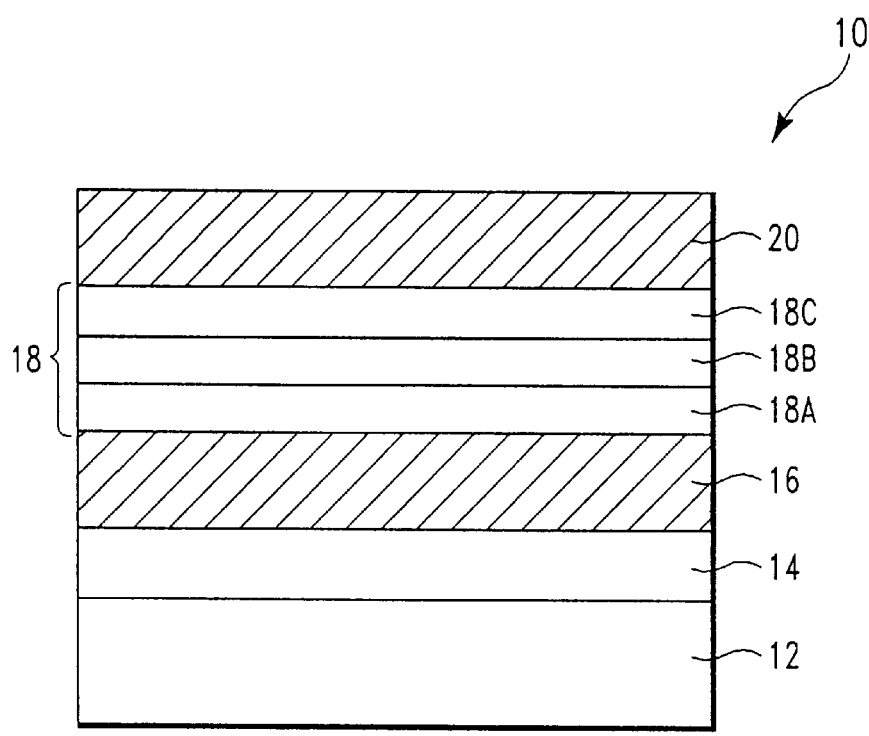

In FIG. 1(B), all the components of the capacitive element of FIG. 1(A) are present except that the multilayer ferroelectric film contains three ferroelectric materials denoted as 18A, 18B and 18C, respectively. It is noted that in this embodiment of the present invention at least two of the ferroelectric materials 18A, 18B, and 18C must be composed of different ferroelectric materials and/or more than one composition of ferroelectric material.

FIGS. 1(A) and (B) represent basic capacitive elements that can contain the multilayer ferroelectric film of the present invention. It should be noted that other capacitive elements containing the ferroelectric film of the present invention having four or more multilayers are also within the contemplation of the present invention. In those embodiments, it is again noted that the multilayer ferroelectric film must be composed of at least two different ferroelectric materials and/or more than one composition of the ferroelectric material.

Suitable semiconductor substrates or wafers that can be employed in the present invention as element 12 are any semiconducting materials including, but not limited to: silicon (Si), Ge, SiGe, GaAs, InAs, InP and all other III/V compounds. Of these semiconductor materials, it is highly preferred that semiconductor substrate or wafer 12 of capacitive element 10 be composed of Si.

Insulator layer 14 may be composed of any material which is capable of insulating semiconductor substrate or wafer 12 from first electrode 16. Suitable insulators include, but are not limited to: oxides such as silicon dioxide, $Al_2O_3$, $Ta_2O_5$, $TiO_2$, $CrO_2$, $HfO_2$, $Y_2O_3$ and TEOS; nitrides such as silicon nitride, tantalum nitride, titanium nitride; oxynitrides such as $SiO_xN_y$; high dielectric constant metal oxides ($\epsilon \geq 30$) such as $BaSiTiO_3$, $BaTiO_3$ and $SrTiO_3$; xerogels; and combinations; multilayers or mixtures thereof. Of these insulators, it is highly preferred that insulator layer 14 be composed of silicon dioxide.

Insulator layer 14 is formed on the surface of semiconductor substrate or wafer 12 utilizing conventional deposition techniques that are well known to those skilled in the art. For example, chemical vapor deposition, physical vapor deposition, sputtering, evaporation, spin-on coating, dip coating and other like deposition techniques may be used in forming the insulator layer on the semiconductor substrate or wafer. While not critical to the present invention, the thickness of the insulator layer is generally of from about 1 to about 1000 nm.

First and second electrodes 16 and 20, respectively are composed of conductive materials including, but not limited to: noble metals including Pt, Ir, Pd and Ru; alloys of noble metals; alloys of noble metals and nonnoble metals; conductive oxides such as $IrO_2$, $RuO_2$, $RhO_2$, $SrRuO_3$, $LaSrCoO_3$, $La_{0.5}Sr_{0.5}CoO_3$, $YBaCuO_3$ and $YBa_2Cu_3O_{7.8}$; combinations; multilayers and mixtures thereof. The first electrode may be composed of the same or different conductive material(s) as the second electrode. It is however highly preferred if the first and second electrodes are composed of the same conductive material.

The electrodes are fabricated using conventional deposition techniques such as chemical vapor deposition, evaporation, electroplating, sputtering or physical vapor deposition that are well known to those skilled in the art. The second or upper electrode 20 may be planarized using conventional techniques such as chemical mechanical polishing and/or patterned depending upon the intended use of the capacitive element.

Multilayer ferroelectric film 18 of capacitive element 10 is composed of at least two different materials which are ferroelectric, i.e., the material is a crystalline, polycrystalline or amorphous substance which displays a spontaneous electric polarization. It is also within the contemplation of the present invention to employ more than one composition of the ferroelectric material as film 18. Suitable ferroelectric materials that can be employed in the present invention include, but are not limited to: the perovskite-type oxides, compounds-containing pyrochlore structures such as $Cd_2Nb_2O_7$, potassium dihydrogen phosphates, phosphates of rubidium, cesium or arsenic and other like ferroelectric materials.

Of the aforementioned ferroelectric materials, it is highly preferred that the multilayer ferroelectric film of the present invention be composed of perovskite-type oxides. The term "perovskite-type oxide" is used herein to denote a material which includes at least one acidic oxide containing at least one metal from Group IVB (Ti, Zr or Hf), VB (V, Nb or Ta), VIB (Cr, Mo or W), VIIB (Mn or Re) or IB (Cu, Ag or Au) of the Periodic Table of Elements (CAS version) and at least one additional cation having a positive formal charge of from about 1 to about 3. Such perovskite-type oxides typically have the basic formula: $ABO_3$ wherein A is one of the above mentioned cations, and B is one of the above mentioned metals which forms the acidic oxide.

Suitable perovskite-type oxides include, but are not limited to: titanate-based ferroelectrics, manganate-based materials, cuprate-based materials, tungsten bronze-type niobates, tantalates, or titanates, and bismuth layered-tantalates, niobates or titanates. Of these perovskite-type oxides, it is preferred to use strontium bismuth tantalate, strontium bismuth niobate, bismuth titanate, strontium bismuth tantalate niobate, lead zirconate titanate, lead lanthanum zirconate titanate, and compositions of these materials modified by the incorporation of dopants as the ferroelectric materials.

In one embodiment, the multilayer ferroelectric film is composed of two of the aforementioned perovskite-type oxides. In another embodiment, the multilayer ferroelectric film is composed of two different perovskite-type oxides comprising a first set of one or more strontium bismuth tantalate layers and a second set of one or more bismuth titanate layers.

The multilayer ferroelectric film is formed using conventional deposition techniques well known to those skilled in the art including, but not limited to: chemical solution deposition (CSD), sol gel, metal-organic decomposition, spin coating, sputtering, metal-organic chemical vapor deposition, physical vapor deposition, plasma-assisted chemical vapor deposition, pulsed laser deposition, chemical vapor deposition, evaporation and like deposition techniques. Of these techniques, it is preferred that the multilayer ferroelectric film of the present invention be formed using CSD.

As stated above, the multilayer ferroelectric film of the present invention is composed of at least two different ferroelectric materials and/or more than one composition of the ferroelectric material. The thickness of each individual layer of the multilayer film varies depending on the ferroelectric materials used in fabricating the same. The multilayer ferroelectric film of the present invention typically has an overall thickness of from about 30 to about 400 nm.

After depositing the multilayer ferroelectric film, the ferroelectric film is annealed using conditions which have not yet been used in processing such films. As stated in the background section of this application, single layer ferroelectric films are typically processed, i.e. annealed, at temperatures at or about 800° C. for time periods of from about 30 minutes or higher. In accordance with the method of the present invention, the deposited multilayer ferroelectric film is annealed using a low temperature, rapid anneal process. Specifically, annealing is carried out in an oxidizing gas such as oxygen, $N_2O$, ozone or mixtures of gases including an oxidizing gas, e.g. air, at temperatures below 800° C. for a time period of from about 5 to about 120 min. Preferred annealing conditions are at a temperature of from about 500° to about 750° C. for a time period of from about 10 to about 60 min.

It is noted that the low temperature, rapid anneal conditions employed in the present invention provide multilayer ferroelectric films that have improved microstructural porosity and reduced leakage current. More specifically, the multilayer ferroelectric films of the present invention have a high remanent polarization, 2Pr of 10 $\mu C/cm^2$ or greater, and no fatigue at 3V measured using 10" cycles. Moreover, when used in a capacitive element, the resultant structure does not contain any interfacial layers between the electrodes and the underlying contacts and/or between the multilayer ferroelectric film and the upper and lower contacts.

The capacitive element of the present invention may be used in a wide variety of applications, including the fabrication of non-volatile storage devices such as NVRAM and FRAM or in a DRAM circuit wherein the capacitive element can be used to provide additional charge over the insulator in the paraelectric state.

The following examples are given to illustrate the scope of the present invention. Because these examples are given for illustrative purposes only, the invention embodied therein should not be limited thereto.

EXAMPLE 1

Preparation of Sr(Butoxyethoxide)$_2$

Under nitrogen, 26.1 g strontium metal was added to 293 g of butoxyethanol. The resultant slurry was refluxed for 1 h to complete the reaction. The solution was cooled to room temperature, and filtered through a celite bed in vacuo. The filtrate was the strontium butoxyethoxide stock solution having a concentration of 0.919 moles/liter or 8.92 weight percent of strontium.

EXAMPLE 2

Preparation of Bi(Butoxyethoxide)$_3$

Under nitrogen, with stirring, 20 g bismuth (III) t-pentoxide was added to 50 ml of butoxyethanol. The t-pentanol was distilled away, and an additional 50 ml of butoxyethanol was added and refluxed for 1 h. The solution was cooled to room temperature, and filtered through a celite bed in vacuo. The filtrate was the bismuth butoxyethoxide stock solution having a final concentration of 0.4 moles/liter of bismuth.

EXAMPLE 3

Preparation of Bi(Ethylhexanote)$_3$

Bismuth ethylhexanoate was dissolved in butoxyethanol. The solution was filtered resulting in a 13.84 weight percent of bismuth in solution.

EXAMPLE 4

Preparation of Ta(Butoxyethoxide)$_5$

Under nitrogen, with stirring, 53.13 g tantalum (V) ethoxide was added to 150 ml of butoxyethanol. Ethanol was distilled away, and an additional 50 ml of butoxyethanol was added and refluxed for 1 h. The solution was cooled to room temperature, and filtered through a celite bed in vacuo. The filtrate was the tantalum butoxyethoxide stock solution.

EXAMPLE 5

Preparation of Nb(Butoxyethoxide)$_5$

Under nitrogen, with stirring, 52.77 g niobium (V) ethoxide was added to 150 ml of butoxyethanol. Ethanol was distilled away and an additional 50 ml of butoxyethanol was added and refluxed for 1 h. The solution was cooled to room temperature, and filtered through a celite bed in vacuo. The filtrate was the niobium butoxyethoxide stock solution with a final concentration of 1.127 moles/liter or 9.75 weight percent of niobium.

EXAMPLE 6

Preparation of Ti(Butoxyethoxide)$_4$

Under nitrogen, 110 g titanium (IV) isopropoxide was added to 100 ml of butoxyethanol. Isopropanol was distilled away and an additional 100 ml of butoxyethanol was added and refluxed for 1 h. The solution was cooled to room temperature, and filtered through a celite bed in vacuo. The filtrate was the titanium butoxyethoxide stock solution with a final concentration of 1.53 moles/liter or 7.91 weight percent of titanium.

EXAMPLE 7

Fabrication of a $Sr_{0.9}Bi_{2.1}Ta_2O_9$ (SBT) Stock Solution

Under nitrogen, 0.022 mol of strontium butoxyethoxide (Example 1), 0.054 mol bismuth ethylhexanoate (Example 3) and 0.050 mol of tantalum butoxyethoxide (Example 4) were mixed together. The resultant mixture was stirred overnight at room temperature, filtered and diluted to 100 ml. A spin solution was prepared by diluting 1 part SBT solution with one part butoxyethanol.

EXAMPLE 8

Fabrication of a $Sr_{0.8}Bi_{2.2}Ta_2O_9$ Solution

Under nitrogen, 0.014 mol of a strontium butoxyethoxide (Example 1), 0.040 mol bismuth ethylhexanoate (Example 3), and 0.036 mol of a tantalum butoxyethoxide (Example 4) were added together. The resultant mixture was stirred overnight at room temperature, filtered and diluted to 50 ml.

EXAMPLE 9

Fabrication of a Bismuth Titanate Stock Solution

Under nitrogen, 0.02 mol of a bismuth ethylhexanoate (Example 3) and 0.015 mol of a titanium butoxyethoxide (Example 6) were mixed together and stirred overnight at room temperature. The solution was filtered and diluted to 100 ml with butoxyethanol. A spin solution was prepared by diluting 1 part bismuth titanate (BIT) stock solution with one part butoxyethanol.

EXAMPLE 10

Fabrication of a 2L (L=Layer) BIT/6L SBT Film

The SBT spin solution (Example 7) was loaded into a syringe and a 0.45 $\mu$m and 0.1 $\mu$m Whatman syringe filters were attached. The solution was syringed onto a Pt/Ti/SiO$_2$/Si substrate. The sample was then spun for 60 sec at 2500 rpm. The coated substrate was dried on a hot plate at 300° C., a second layer was applied and then the two SBT layers were annealed by rapid thermal processing at 750° C. for 4 min. This was repeated two more times to generate a 6L SBT film. The BIT spin solution (Example 8) was loaded into a syringe and a 0.45 $\mu$m and 0.1 $\mu$m Whatman syringe filters were attached. The solution was syringed onto 6L SBT Pt/Ti/SiO$_2$/Si substrate until the substrate was completely wetted. The substrate was then spun for 30 sec at 2500 rpm. The coated substrate was dried on a hot plate at 300° C., a second layer was applied and then the completed 2L BIT/6L SBT film was annealed by rapid thermal processing at 700° C. for 1 min.

EXAMPLE 11

Fabrication of a 1L BIT/2L SBT/2L BIT/2L SBT Film

The SBT spin solution (Example 7) was loaded into a syringe and a 0.45 $\mu$m and 0.1 $\mu$m Whatman syringe filters were attached. The solution was syringed onto a Pt/Ti/SiO$_2$/Si substrate. The sample was then spun for 60 sec at 2500 rpm. The coated substrate was dried on a hot plate at 300° C., a second layer was applied and then the two SBT layers were annealed by rapid thermal processing at 750° C. for 4 min. The BIT spin solution (Example 8) was loaded into a syringe and a 0.45 $\mu$m and 0.1 $\mu$m Whatman syringe filters were attached. The solution was syringed onto 2L SBT/Pt/Ti/SiO$_2$/Si substrate until the substrate was completely wetted. The substrate was then spun for 30 sec at 2500 rpm. The coated substrate was dried on a hot plate at 300° C., a second layer was applied and then the 2L BIT/2L SBT film was annealed by rapid thermal processing at 700° C. for 1 min. The SBT spin solution (Example 7) was syringed onto the 2L BIT/2L SBT film. The sample was then spun for 60 sec at 2500 rpm. The coated substrate was dried on a hot plate at 300° C., a second layer was applied and then the 2L SBT/2L BIT/2L SBT film were annealed by rapid thermal processing at 750° C. for 4 min. A final 1L BIT capping layer was applied. The BIT spin solution (Example 8) was syringed onto 2L SBT/2L BIT/2L SBT film until completely wetted. The substrate was then spun for 30 sec at 2500 rpm. The coated substrate was dried on a hot plate at 300° C., and the 1L/2L SBT/2L BIT/2L SBT film was annealed by rapid thermal processing at 700° C. for 45 sec.

EXAMPLE 12

Fabrication of a 1L BIT/3L SBT/1L BIT/3L SBT Film

The SBT spin solution (Example 7) was loaded into a syringe and a 0.45 $\mu$m and 0.1 $\mu$m Whatman syringe filters were attached. The solution was syringed onto a Pt/Ti/SiO$_2$/Si substrate. The sample was then spun for 60 sec at 2500 rpm. The coated substrate was dried on a hot plate at 300° C., a second and third layer were applied and then the three SBT layers were annealed by rapid thermal at 750° C. for 10 min. The BIT spin solution (Example 8) was loaded into a syringe and a 0.45 $\mu$m and 0.1 $\mu$m Whatman syringe filters were attached. The solution was syringed onto 3L SBT/Pt/Ti/SiO$_2$/Si substrate until the substrate was completely wetted. The substrate was then spun for 30 sec at 2500 rpm. The coated substrate was dried on a hot plate at 300° C., and the 1L BIT/3L SBT film was annealed by rapid thermal processing at 700° C. for 45 sec. The SBT spin solution (Example 7) was syringed onto the 1L BIT/3L SBT film. The sample was then spun for 60 sec at 2500 rpm. The coated substrate was dried on a hot plate at 300° C., a second and third SBT layer was applied and then the 3L SBT/1L BIT/3L SBT film were annealed by rapid thermal processing at 750° C. for 6 min. A final 1L BIT capping layer was applied. The BIT spin solution (Example 8) was syringed onto 3L SBT/1L BIT/3L SBT film until completely wetted. The substrate was then spun for 30 sec at 2500 rpm. The coated substrate was dried on a hot plate at 300° C., and the 1L BIT/3L SBT/1L BIT/3L SBT film was annealed by rapid thermal processing at 700° C. for 45 sec.

EXAMPLE 13

Fabrication of a 4L SBT/2L BIT Film

The BIT spin solution (Example 8) was loaded into a syringe and a 0.45 $\mu$m and 0.1 $\mu$m Whatman syringe filters were attached. The solution was syringed onto Pt/Ti/SiO$_2$/Si substrate until the substrate was completely wetted. The substrate was then spun for 30 sec at 2500 rpm. The coated substrate was dried on a hot plate at 300° C., a second layer was applied and then the 2L BIT film was annealed by rapid thermal processing at 700° C. for 45 sec. The SBT spin solution (Example 7) was loaded into a syringe and a 0.45 $\mu$m and 0.1 $\mu$m Whatman syringe filters were attached. The solution was syringed onto a 2L BIT/Pt/Ti/SiO$_2$/Si substrate. The sample was then spun for 60 sec at 2500 rpm. The coated substrate was dried on a hot plate at 300° C., a second, third and fourth layer were applied and then the 4L SBT/2L BIT film was annealed by rapid thermal processing at 750° C. for 6 min.

EXAMPLE 14

Fabrication of a $Sr_{0.85}Bi_{2.2}Ta_2O_9$ Film

Under nitrogen, 0.015 mol of strontium butoxyethoxide, 0.035 mol of tantalum butoxyethoxide, and 0.039 mol of bismuth ethylhexanoate were mixed at room temperature. The solution was stirred overnight, filtered and diluted to 100 g. Before spinning, one part solution was diluted with two parts butoxyethanol. The SBT spin solution was loaded into a syringe and a 0.45 $\mu$m and 0.1 $\mu$m Whatman syringe filters were attached. The solution was syringed onto a Pt/SiO$_2$/Si substrate until the substrate was completely wetted. The substrate was then spun for 60 sec at 2500 rpm. The coated substrate was dried on a hot plate at 395° C. and then rapidly thermally annealed in $O_2$ at 725° C. for 30 sec. Three additional layers were deposited to fabricate thicker films. A final furnace anneal was conducted at 800° C. for 60 min. Pt electrodes were deposited and a post electrode anneal was conducted at 800° C. for 2 min. The resultant 194 nm film had a Pr of 7.4 $\mu C/cm^2$ at 3V with $10^{-8}$ $A/cm^2$ leakage current at 4V.

EXAMPLE 15

Fabrication of a $Sr_{0.76}Bi_{2.4}Nb_2O_9$ Film

Under nitrogen, 0.014 mol of strontium butoxyethoxide, 0.034 mol of niobium butoxyethoxide, and 0.044 mol of bismuth ethylhexanoate were mixed at room temperature. The solution was stirred overnight, filtered and diluted to 100 g. Before spinning, one part solution was diluted with two parts butoxyethanol. The SBN spin solution was loaded into a syringe and 0.45 $\mu$m and 0.1 $\mu$m Whatman syringe filters were attached. The solution was syringed onto a $Pt/SiO_2/Si$ substrate until the substrate was completely wetted. The substrate was then spun for 60 sec at 2500 rpm. The coated substrate was dried on a hot plate at 350° C. A second layer was spun and hot plate baked and an RTA anneal was conducted at 750for 4 min. Four additional layers were spun and hot plate baked. A final RTA anneal was conducted at 750° C. for 6 min. Pt electrodes were deposited and a post electrode anneal was conducted at 750° C. for 16 min. The resultant 230 nm film had a Pr of 2.6 $\mu C/cm^2$ at 3V with $10^{-7}$ $A/cm^2$ leakage current at 4V.

EXAMPLE 16

Fabrication of a BIT/SBT Film

Figure 2:
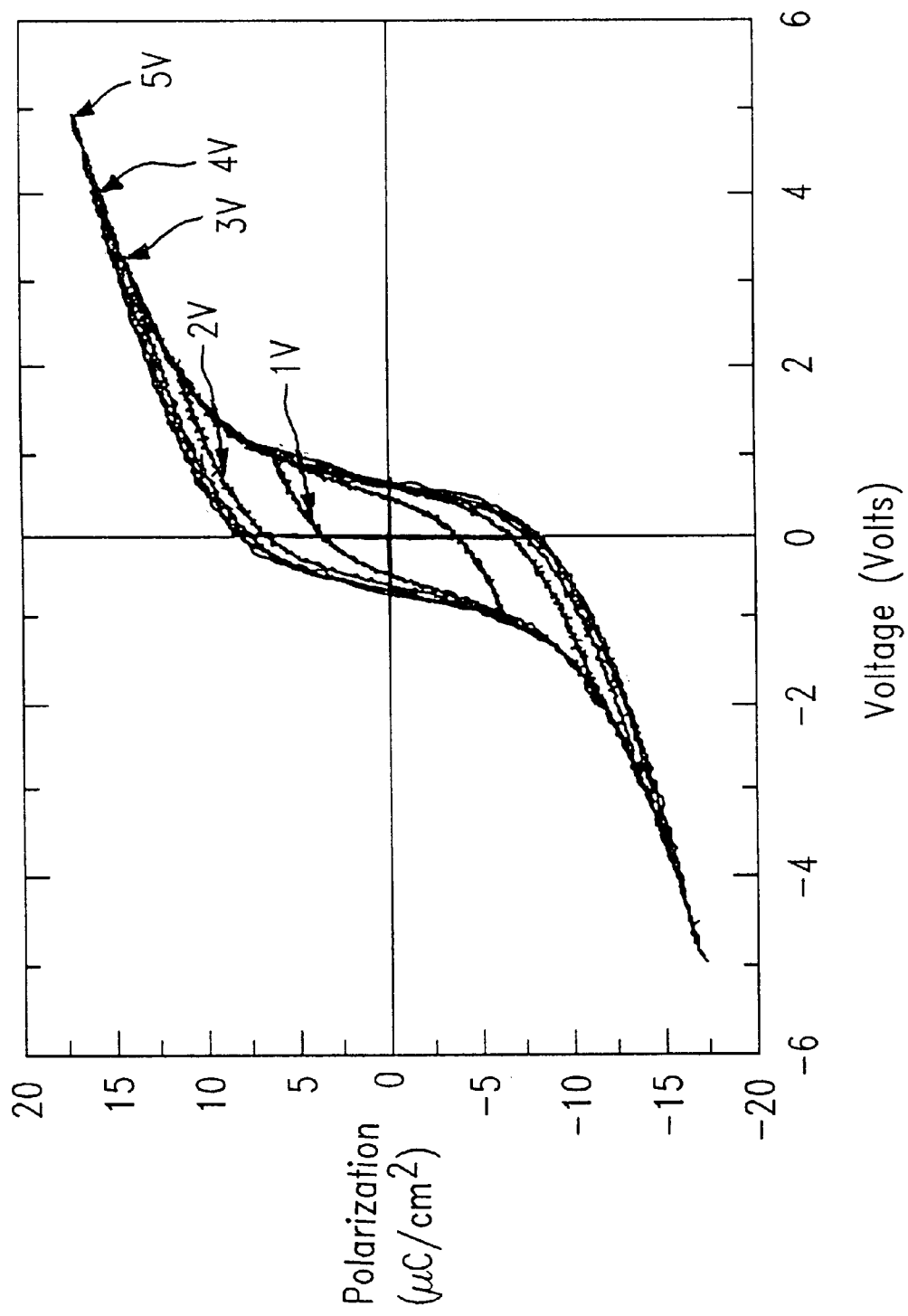
FIG. 2 shows a hystersis curve at five different voltages of a ferroelectric capacitor using bismuth titanate and strontium bismuth tantalate as the ferroelectric.
Figure 3:
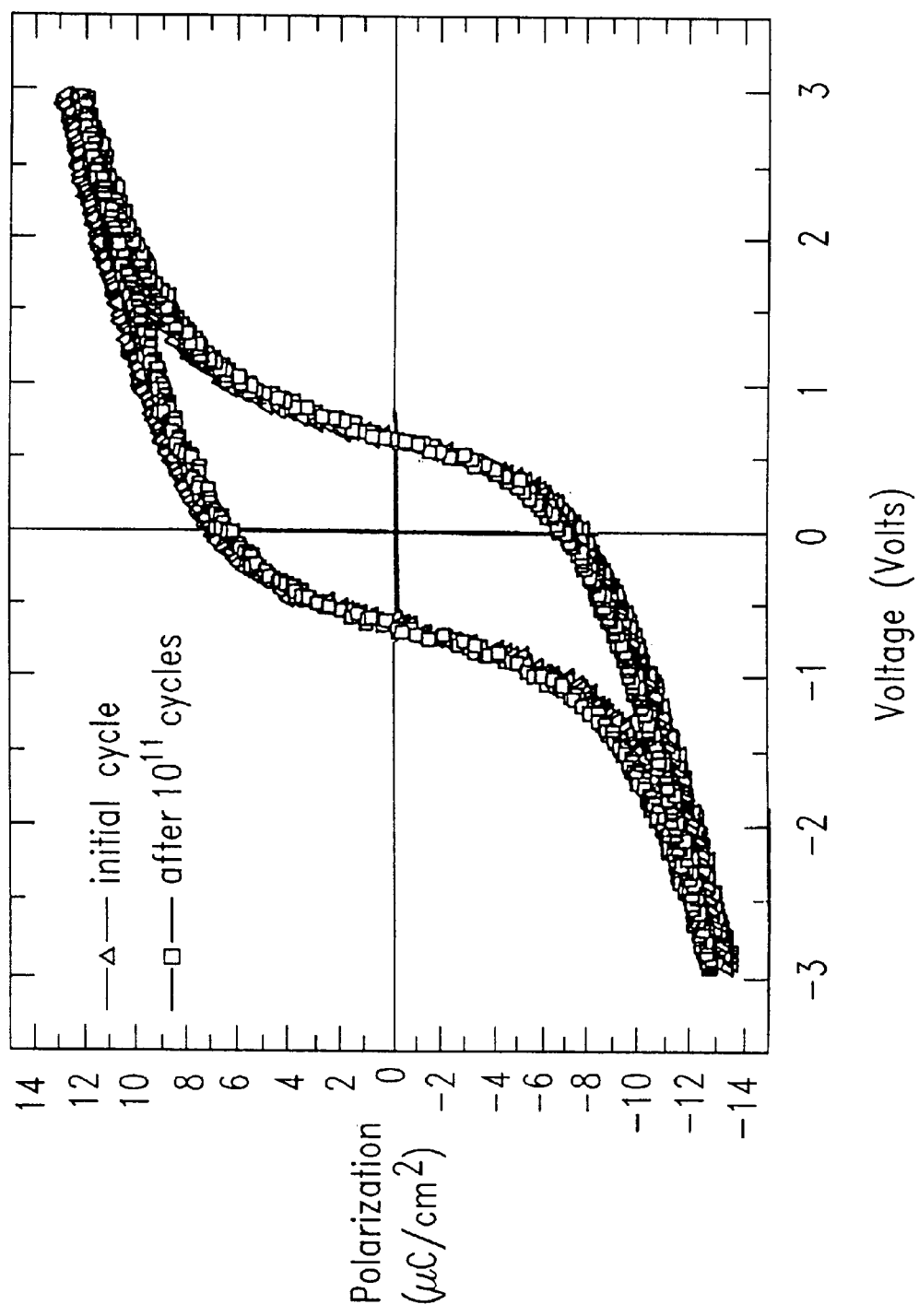
FIG. 3 shows an initial hystersis curve after 10" cycles of a ferroelectric capacitor using bismuth titanate and strontium bismuth tantalate as the ferroelectric.

The SBT spin solution (Example 15) was loaded into a syringe and 0.45 $\mu$m and 0.1 $\mu$m Whatman syringe filters were attached. The solution was syringed onto a $Pt/Ti/SiO_2/Si$ substrate. The sample was then spun for 60 sec at 2500 rpm. The coated substrate was dried on a hot plate at 350° C. and two more layers of SBT applied with a hot plate bake at 350° C. between each SBT layer. The coated substrate with 3L SBT was then annealed by rapid thermal processing at 750° C. for 6 min. The BIT spin solution (Example 14) was loaded into a syringe and 0.45 $\mu$m and 0.1 $\mu$m Whatman syringe filters were attached. The solution was syringed onto 3L $SBT/Pt/SiO_2/Si$ substrate until the substrate was completely wetted. The substrate was then spun for 60 sec at 2500 rpm. The completed 1L BIT/3L SBT film was annealed by rapid thermal processing at 700° C. for 45 sec. Pt electrodes were deposited and a post electrode anneal was conducted at 750° C. for 15 min. The resultant 120 nm film had a Pr of 7.7 $\mu C./cm^2$ at 3V with $10^{-8}$ $A/cm^2$ leakage current at 4V (FIG. 2). Representative hystersis loops are measured at 1–5 Volts. No fatigue was measured in the film out to 10" cycles (FIG. 3).

EXAMPLE 17

Fabrication of a BIT/SBT/SBN/SBT Film

The SBT spin solution (Example 15) was loaded into a syringe and a 0.45 $\mu$m and 0.1 $\mu$m Whatman syringe filters were attached. The solution was syringed onto a $Pt/SiO_2/Si$ substrate. The sample was then spun for 60 sec at 2500 rpm. The coated substrate was dried on a hot plate at 350° C. The SBN spin solution (Example 15) was loaded into a syringe and 0.45 $\mu$m and 0.1 $\mu$m Whatman syringe filters were attached. The solution was syringed onto the 1L SBT coated substrate. The sample was then spun for 60 sec at 2500 rpm. The coated substrate was dried on a hot plate at 350° C. and one more layer of SBT was applied with a hot plate bake. The coated substrate with 1L SBT/1L SBN/1L SBT structure was then annealed by rapid thermal processing at 750° C. for 6 min. The BIT spin solution (Example 14) was loaded into a syringe and 0.45 $\mu$m and 0.1 $\mu$m Whatman syringe filters were attached. The solution was syringed onto the 1L SBT/1L SBN/1L $SBT/Pt/SiO_2/Si$ substrate until the substrate was completely wetted. The substrate was then spun for 30 sec at 2500 rpm. The completed 1L BIT/1L SBT/1L SBN/1L SBT film was annealed by rapid thermal processing at 700° C. for 45 sec. Pt electrodes were deposited and a post electrode anneal was conducted at 750° C. for 16 min. The resultant 128 nm film had a Pr of 7.3 $\mu C/cm^2$ at 3V with $10^{-7}$ $A/cm^2$ leakage current at 4V.

The above embodiments and examples are given to illustrate the scope and spirit of the invention. These embodiments and examples will make apparent, to those skilled in the art, other embodiments and examples. These other embodiments and examples are within the contemplation of the present invention; therefore, the instant invention should be limited only to the appended claims.

Having thus described our invention, what we claim as new, and desire to the secure by the Letters Patent is:

1. A capacitive element comprising a substrate; a first electrode formed on said substrate; a multilayer ferroelectric film formed on said first electrode, said multilayer ferroelectric film is composed of more than one ferroelectric material; and a second electrode formed on said multilayer ferroelectric film.

2. The capacitive element of claim 1 wherein said substrate comprises a semiconducting material or wafer.

3. The capacitive element of claim 2 wherein said substrate further contains an insulator layer selected from the group consisting of oxides, nitrides, oxynitrides, high dielectric constant metal oxides, xerogels, combinations, multilayers and mixtures thereof.

4. The capacitive element of claim 2 wherein said semiconducting material or wafer is composed of a material selected from the group consisting of silicon (Si), Ge, SiGe, GaAs, InAs, InP and all other III/V compounds.

5. The capacitive element of claim 1 wherein said first and said second electrodes are composed of the same or different conductive materials and are selected from the group consisting of noble metals, alloys of noble metals, alloys of noble and non-noble metals, conductive oxides and combinations, multilayers or mixtures thereof.

6. The capacitive element of claim 5 wherein said first and second electrodes are composed of the same conductive materials.

7. The capacitive element of claim 1 wherein said ferroelectric material is a material selected from the group consisting of a perovskite-type oxide, a compound containing a pyrochlore structure, potassium dihydrogen phosphate and a phosphate of rubidium, cesium or arsenic.

8. The capacitive element of claim 1 wherein said ferroelectric material is a perovskite-type oxide having the formula $ABO_3$ wherein B is at least one acidic oxide containing a metal from Group IVB, VB, VIB, VIIB or IB of the Periodic Table of Elements, and A is at least one additional cation having a positive formula charge of from about 1 to about 3.

9. The capacitive element of claim 8 wherein said perovskite-type oxide is an oxide selected from the group consisting of a titanate-based ferroelectric, a manganate-based material, a cuprate-based material, a tungsten bronze-type niobate, tantalate or titanate, and a layered bismuth tantalate, niobate or titanate.

10. The capacitive element of claim 1 wherein said ferroelectric material is selected from the group consisting of bismuth titanate, strontium bismuth tantalate, strontium bismuth niobate, strontium bismuth tantalate niobate, lead zirconate titanate, lead lanthanum zirconate titanate and compositions of these materials modified by incorporation of a dopant.

11. The capacitive element of claim 1 wherein said multilayer ferroelectric film is composed of two different perovskite-type oxides selected from the group consisting of bismuth titanate, strontium bismuth tantalate, strontium bismuth niobate, strontium bismuth tantalate niobate, lead zirconate titanate, lead lanthanum zirconate titanate and compositions of these materials modified by incorporation of a dopant.

12. The capacitive element of claim 1 wherein said multilayer ferroelectric film is composed of two different perovskite-type oxides, said two different perovskite-type oxides comprising a first set of one or more strontium bismuth tantalate layers and a second set of one or more bismuth titanate layers.

13. A non-volatile storage device comprising at least the capacitive element of claim 1.

14. A DRAM circuit comprising at least the capacitive element of claim 1.

15. A FRAM circuit comprising at least the capacitive element of claim 1.

* * * * *